US006563166B1

(12) United States Patent
Ni

(10) Patent No.: US 6,563,166 B1
(45) Date of Patent: May 13, 2003

(54) FLASH CELL DEVICE

(75) Inventor: Cheng-Tsung Ni, Hsinchu Hsien (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/523,064

(22) Filed: Mar. 10, 2000

(30) Foreign Application Priority Data

Mar. 11, 1999 (TW) .......................................... 88103786

(51) Int. Cl.$^7$ ............................................ H01L 29/788
(52) U.S. Cl. ...................... 257/316; 257/321; 438/767; 438/279
(58) Field of Search ................................ 438/257, 267, 438/279, 315; 257/316, 315, 321

(56) References Cited

U.S. PATENT DOCUMENTS

| | | | | |
|---|---|---|---|---|
| 4,686,558 A | * | 8/1987 | Adam | 357/42 |
| 5,079,603 A | * | 1/1992 | Komori et al. | 357/23.5 |
| 5,411,905 A | * | 5/1995 | Acovic et al. | 437/43 |
| 5,429,969 A | * | 7/1995 | Chang | 437/43 |
| 5,494,838 A | * | 2/1996 | Chang et al. | 437/43 |
| 5,753,953 A | | 5/1998 | Fukumoto | 257/316 |
| 5,776,810 A | * | 7/1998 | Guterman et al. | 438/258 |
| 5,966,604 A | * | 10/1999 | Lin et al. | 438/279 |
| 5,981,341 A | * | 11/1999 | Kim et al. | 438/264 |
| 5,986,934 A | * | 11/1999 | Kao et al. | 365/185.18 |
| 6,017,796 A | * | 1/2000 | Chen et al. | 438/264 |
| 6,037,228 A | * | 3/2000 | Hsu | 438/279 |
| 6,097,059 A | * | 8/2000 | Yamada | 257/321 |
| 6,103,608 A | * | 8/2000 | Jen et al. | 438/592 |
| 6,117,733 A | * | 9/2000 | Sung et al. | 438/265 |
| 6,136,717 A | * | 10/2000 | Winnerl et al. | 438/705 |
| 6,143,606 A | * | 11/2000 | Wang et al. | 438/257 |
| 6,143,609 A | * | 11/2000 | Sato et al. | 438/266 |
| 6,469,341 B1 | * | 10/2002 | Sung et al. | 257/316 |

* cited by examiner

Primary Examiner—Olik Chaudhuri
Assistant Examiner—Fernando Toledo
(74) Attorney, Agent, or Firm—Burns, Doane, Swecker & Mathis LLP

(57) ABSTRACT

A memory device includes a first memory cell and a second memory cell both controlled by a common control gate. The device includes: a substrate; first and second stacks each including an insulating layer formed over the substrate, a first conductive layer formed over the insulating layer and providing a select gate, and a first dielectric layer formed over the first conductive layer, each of the stacks also including an inner sidewall and an outer sidewall, the. stacks being separated by a common area of the substrate, the inner and outer sidewalls of the stacks being coated with a second dielectric layer; first and second spacers formed adjacent the inner sidewalls of the first and second stacks respectively, the first and second spacers being separated by a medial portion of the common source area of the substrate, each of the spacers. including a tunnel oxide layer disposed over the substrate, and a second conductive layer disposed over the tunnel oxide layer and providing a floating gate; first and second drain regions formed in the substrate proximate the outer sidewalls of the first and second stacks; a common source region formed beneath the common source area; a third dielectric layer disposed over the first and second spacers, and the first and second stacks; and a third conductive layer, disposed over inner portions of the first and second select gate stacks, and forming the common control gate.

23 Claims, 4 Drawing Sheets

FLASH CELL DEVICE

BACKGROUND OF THE INVENTION

1. Field of the Invention

The present invention relates generally to semiconductor memory devices, and more specifically to a memory device and the process of manufacturing such a device.

2. Description of the Prior Art

An electrically erasable programmable read only memory (EEPROM) cell is a nonvolatile writable and erasable memory cell which requires very low operating currents. The unit cell of an EEPROM may be formed by connecting a memory transistor in series with a select transistor. Some EEPROM designs are integrated so that the features of the two transistors are merged. Flash EEPROMs describe a family of single-transistor cell EEPROMs. Cell sizes of Flash EEPROMs are about half that of two transistor EEPROMs.

Flash memory designs differ in their cell structure based on whether they require one or several transistors per cell. Single-transistor self-aligned stacked-gate cells are well known. However, the single-transistor cell suffers from the possibility of over-erasure and consequent current leakage. A split-gate cell provides the equivalent of a two-transistor architecture, but requires only a little more chip area than a single transistor cell. Through a diffusion process, the split-gate creates a phantom transistor that looks like a series transistor. This allows the cell to be isolated from others in a column.

FIG. 1 shows a cross sectional elevation view of a conventional flash memory device at 10, the memory device including: a first memory cell 12 and a second memory cell 14 formed over a substrate 16, each of the cells sharing a common source region 18; and first and second drain regions 19 and 20 formed in the substrate 16 on opposite sides of the common source region 18. The first and second memory cells 12 and 14 include a first select gate stack 22 and a second select gate stack 24 respectively, each of the select gate stacks 22 and 24 having: a tunnel oxide layer 26 formed over the substrate; a first conductive layer 28 formed over the tunnel oxide layer 26 and providing a select gate of the respective memory cell; and a first dielectric layer 30 formed over the first conductive layer 26; a first spacer 32 formed adjacent an outer sidewall of the corresponding stack 22; and a second spacer 33 formed adjacent an inner sidewall of the corresponding stack 22.

Each memory cells 12 and 14 also include first and second floating gates 40 and 42 respectively. Each of the floating gates 40 and 42 including: a first portion formed over an outer portion of the common source region 18; a second portion formed superjacent an area of the substrate disposed between the common source region 18 and the corresponding one of the select gate stacks 22 and 24; and a third portion disposed over an inner portion of the corresponding one of the select gate stacks 22 and 24. A dielectric layer 44 is formed over the first and second drain regions 19 and 20, the first and second select gate stacks 22 and 24, the first and second floating gates 40 and 42, and the common source region 18. The first and second memory cells 12 and 14 further include first and second control gates 48 and 50 respectively, each of the control gates being formed over portions of the dielectric layer 44 which overly a portion of the corresponding one of the floating gates 40 and 42, and a portion of the corresponding one of the select gate stacks 22 and 24.

There are several problems associated with the manufacturing and performance of the prior art flash memory device 10. One disadvantage associated with the device 10 is that a relatively large area is required for fabricating each of the memory cells 12 and 14 on a semiconductor substrate, and therefore it is difficult to achieve very large scale integration of integrated circuits having such devices. Another disadvantage is that even though the memory cells 12 and 14 share a common source region 18, the separate control gates 48 and 50 of the two memory cells 12 and 14 must be individually selected by a decoding means (not shown). Therefore, device performance suffers. A further problem associated with the prior art flash memory device 10 is that it is difficult to control the fabrication process or the device because of the overlapping of the outer portion of the floating gates 40 and 42 over the inner portions of the first and second select gate stacks 20 and 24. Certain lithography steps required to form the device 10 are difficult to control to a degree of accuracy required to avoid shifting on the selective positions of the overlapping pairs of floating gates 40 and 42 as well as select gate stacks 22 and 24. Such shifting of the selective positions of the overlapping floating gates and select gates can effect performance of the device 10.

Fukumoto (U.S. Pat. No. 5,753,953, issued May 19, 1998) discloses a semiconductor storage device having a drain region and a source region formed in a silicon substrate, a select gate formed on the substrate between the source and drain regions, and a gate insulating film sandwiched between the select gate and substrate. On one side of the select gate, a floating-gate is formed out of a sidewall formed with an insulating film sandwiched. On the floating-gate and the select gate, a control gate is formed with an insulating film sandwiched. The insulating film directly below the floating-gate is formed as a tunnel oxide film which allows FN tunneling of electrons. In an erase operation, electrons are injected into the floating-gate from the silicon substrate, and in a write operation, electrons are extracted from the floating-gate to the drain region. A current required for writing and erasing each cell can be decreased, a low power supply can be used, and the lifetime of the tunnel insulating film can be increased. One disadvantage associated with the device described by Fukumoto is that adjacent memory cells have separate control gates which must be individually selected by a decoding means (not shown).

SUMMARY OF THE INVENTION

It is an object of the present invention to provide a flash semiconductor memory device including a pair of memory cells sharing a common source region, wherein both of the cells may be controlled by a common control gate.

It is another object of the present invention to provide a flash semiconductor memory device including a pair of memory cells sharing a common source region, wherein the amount of space required to fabricate the device on a semiconductor substrate is minimized.

It is a further object of the present invention to provide a process for manufacturing a flash semiconductor memory device including a pair of memory cells sharing a common source region, wherein the manufacturing process is easily controlled.

Briefly, a presently preferred embodiment of the present invention provides a memory device including a first memory cell and a second memory cell both controlled by a common control gate. The device includes: a substrate; a first stack and a second stack, each of the stacks including an insulating layer formed over the substrate, a first conductive layer formed over the insulating layer, and a first dielectric layer formed over the first conductive layer, each of the first and second stacks also including an inner sidewall and an outer sidewall, the inner sidewalls of the first and second stacks opposing each other and being separated by a common area of the substrate, the first conductive layers of the first and second stacks providing select gates of the first and second memory cells respectively, the inner and outer sidewalls of the first and second select gate stacks being coated with a second dielectric layer; first and second spacers are formed adjacent the portions of the second dielectric layer that are coated on the inner sidewalls of the first and second stacks respectively, the first and second spacers being separated by a medial portion of the common source area of the substrate, each of the spacers including a tunnel oxide layer disposed over the substrate, and a second conductive layer disposed over the tunnel oxide layer, the second conductive layers of the first and second stacks providing first and second floating gates of the first and second memory cells respectively, first and second drain regions are formed in the substrate proximate and generally outward from the outer sidewalls of the first and second select gate stacks respectively; a common source region is formed in the substrate generally beneath the common source area. A third dielectric layer is disposed over the medial portion of the common source area of the substrate, over the first and second spacers, and over the first and second stacks; a third conductive layer is disposed over a portion of the third dielectric layer which overlies the inner portions of the first and second select gate stacks, the spacers, and the medial portion of the common source area, the third conductive layer forming the common control gate.

One advantage of the present invention is that it provides a process for manufacturing a semiconductor memory device including a pair of memory cells sharing a common source region, wherein the manufacturing process is easily controlled.

The foregoing and other objects, features, and advantages of the present invention will be apparent from the following detailed description of the preferred embodiment which makes reference to the several figures of the drawing.

IN THE DRAWINGS

DETAILED DESCRIPTION OF THE PREFERRED EMBODIMENTS

Figure 1:
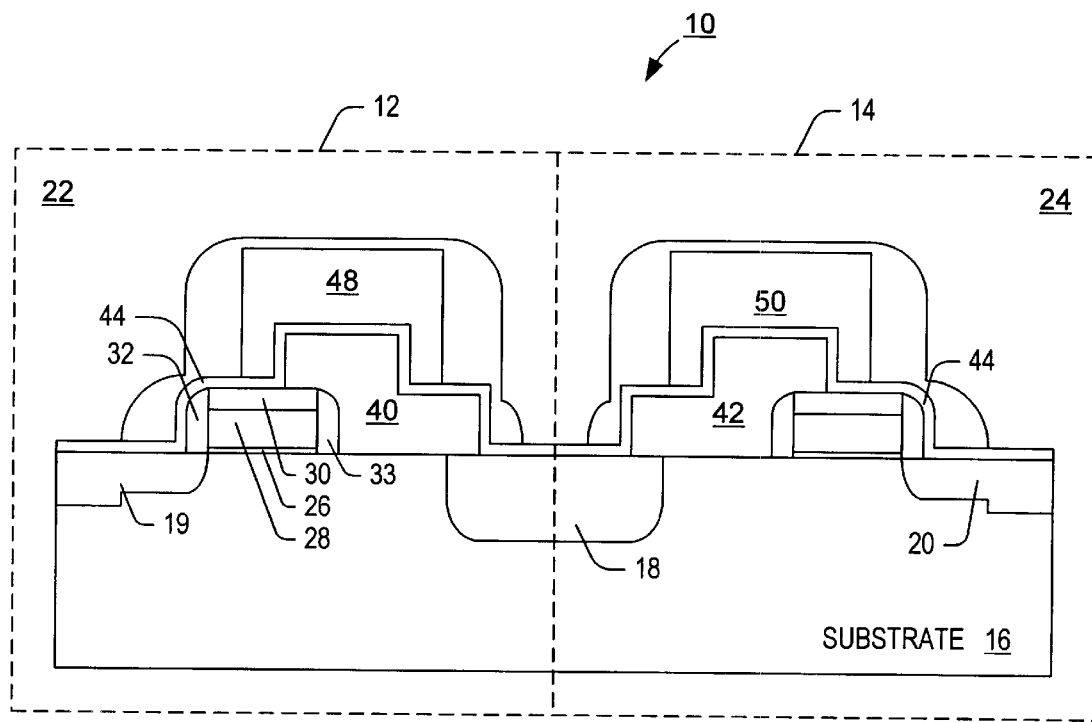
FIG. 1 is a cross sectional elevation view of a conventional semiconductor memory device having a pair of memory cells formed over a substrate and sharing a common source region.
Figures 2A, 2B:
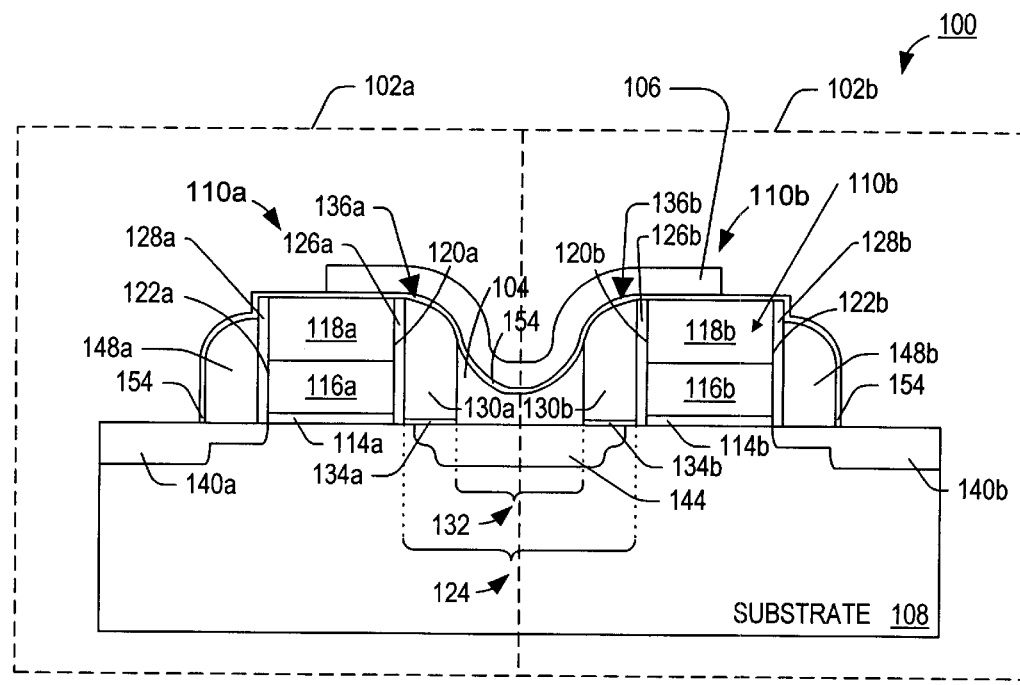
FIG. 2A is a cross sectional elevation view of a first embodiment of a semiconductor memory device in accordance with the present invention, the device including a pair of memory cells sharing a common source region, both cells being controlled by a common control gate.
FIG. 2B is a cross sectional elevation view of a second embodiment of a semiconductor memory device in accordance with the present invention.

FIG. 2A shows a cross sectional elevation view of a first embodiment of a pair of semiconductor flash memory devices at 100 in accordance with the present invention. The device 100 including a first flash memory cell 102a and a second flash memory cell 102b both controlled by a common control gate 106. The pair of flash memory devices 100 includes: a semiconductor substrate 108; a first and second stacks 110a and 110b each having an insulating layer 114a and 114b formed over the substrate 108. The first and second stacks 110a and 110b also include first and second select gates 116a and 116b of the first and second flash memory cells 102a and 102b respectively, each of the select gates 116a and 116b being formed from a conductive layer disposed over an insulating layers 114a and 114b respectively as further explained below. First dielectric layers 118a and 118b are formed over each of the select gates 116a and 116b of the first and second stacks 110a and 110b. Each of the first and second stacks 110a and 110b also has an inner sidewall 120a and 120b and an outer sidewall 122a and 122b respectively. The inner sidewalls 120a and 120b of the first and second select gate stacks 110a and 110b respectively oppose each other and are separated by a common source area 124 of the substrate 108. The inner sidewalls 120a and 120b are each coated with a second dielectric layer 126a and 126b respectively. The outer sidewalls 122a and 122b are each coated with a third dielectric layer 128a and 128b respectively.

The cells 102a and 102b of the pair of flash memory devices 100 include first and second spacers 130a and 130b respectively being formed adjacent the second dielectric layer 126a and 126b respectively, coating on the inner sidewalls 120a and 120b of the first and second stacks 110a and 110b respectively. The first and second spacers 130a and 130b being separated by a medial portion 132 of the common source area 124 of the substrate 108. Each of the spacers 130a and 130b including a tunnel oxide layer 134a and 134b respectively, disposed over the substrate 108. The first and second spacers 130a and 130b function as floating gates 136a and 136b of each of the flash memory cell 102a and 102b respectively. The floating gates 136a and 136b being formed over the tunnel oxide layer 134a and 134b of the first and second flash memory cell 102a and 102b respectively, as further explained below.

The pair of flash memory devices 100 also includes: first and second drain regions 140a and 140b formed in the substrate 108 proximate and generally outward from the outer sidewalls 122a and 122b of the first and second stacks 110a and 110b respectively; and a common source region 144 formed in the substrate 108 generally beneath the common source area 124 and beneath inner portions of the first and second spacers 130a and 130b.

The pair of flash memory devices in 100 further includes: a fourth dielectric layer 104 formed supedjacent the medial portion 132 of the common source area 144 of the substrate 108 between the first and second spacers 130a and 130b; first and second outer spacers 148a and 148b disposed adjacent the third dielectric layer 128a and 128b of the first and second stacks 110a and 110b and generally above the first and second drain regions 140a and 140b of the substrate 108.

A fifth dielectric layer 154 is disposed superjacent the fourth dielectric layer 104 of the medial portion 132 of the common source area 124 of the substrate 108, over the first and second spacers 130a and 130b, over the first and second stacks 110a and 110b and over the first and second outer spacers 148a and 148b. The common control gate 106 is formed from a third conductive layer disposed over inner portions of the first and second stacks 110a and 110b, the spacers 130a and 130b, and a medial portion 132 of the fifth dielectric layer 154.

FIG. 2B shows a cross sectional elevation view of a second embodiment of a pair of flash memory devices at 160 in accordance with the present invention. The pair of flash memory devices in 160 being substantially similar to the pair of flash memory devices in 100 (FIG. 2A) except that first and second spacer 162a and 162b of the devices in 160 extend a distance vertically above the height of the first and second stacks 110a and 110b whereas the first and second spacers 130a and 130b (FIG. 2A) of the devices in 100 are formed to have substantially the same height as the first and second stacks 170a and 170b. The advantage of the structure shown in devices 160 is that it increases the capacitance surface area of the device.

FIGS. 3A through 3F show cross-sectional views generally illustrating a progression of manufacturing steps of a process of manufacturing a pair of flash the memory devices 100 of FIG. 2A in accordance with the present invention. A process of fabricating the pair of flash semiconductor memory devices in 160 (FIG. 2B) in accordance with the present invention is substantially similar to the process of manufacturing the pair of flash memory devices in 100 (FIG. 2A) with the exception of a few differences as further explained below.

Figure 3A:
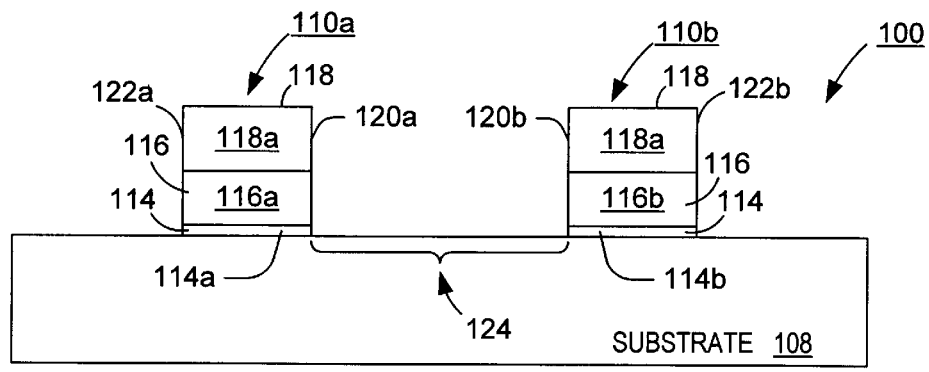
FIGS. 3A through 3F are cross-sectional views generally illustrating a progression of manufacturing steps in accordance with a process of manufacturing the memory device of FIG. 2A in accordance with the present invention.

Referring to FIG. 3A, a first and second stacks 110a and 110b are formed by first forming an insulating layer 114 over the semiconductor substrate 108. The insulating layer 114 is typically formed using an oxide, commonly referred to as a gate oxide. However, other suitable insulating materials are also known to be used. A first conductive layer 116 is formed over the insulating layer 114, and a first dielectric layer 118 is formed over the first conductive layer 116. Subsequently, the insulating layer 114, first conductive layer 116, and first dielectric layer 118 are patterned and etched to expose areas of the substrate 108 including the common source area 124 of the substrate 108 between inner sidewalls 120a and 120b of the first and second stacks 110a and 110b. Each of the stacks including remaining portions of the insulating layer 114a and 114b respectively, first conductive layer 116a and 116b respectively, and the first dielectric layer 118a and 118b resepectively. Each of the stacks further including the outer sidewalls 122a and 122b respectively disposed adjacent corresponding outer exposed areas of the substrate 108. The remaining portions of the first conductive layer 116 form select gates 116a and 116b of the first and second flash memory cells 102a and 102b (FIG. 2A).

Figure 3B:
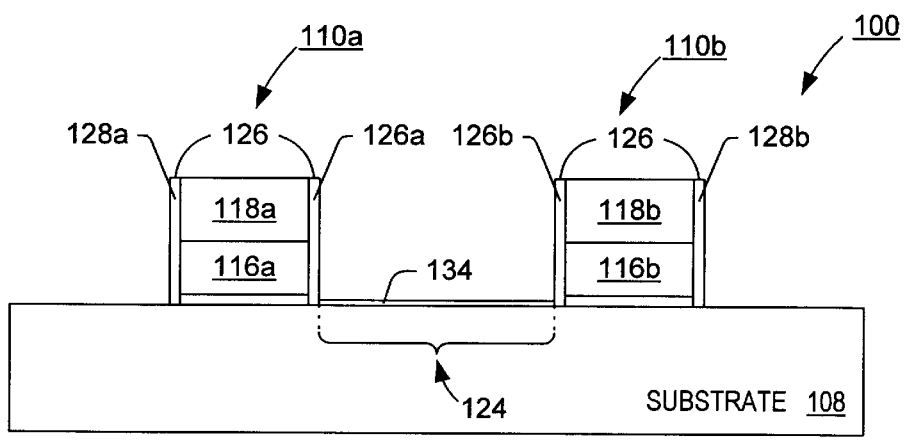

Referring to FIG. 3B, the inner and outer sidewalls 120a, 120b and 122a, 122b of the stacks 110a and 110b are coated with a second dielectric layer 126a, 126b and 128a, 128b respectively. In a preferred embodiment, this step of the manufacturing process includes: depositing a second dielectric layer 126 over the first and second stacks 110a and 110b in accordance with a chemical vapor deposition (CVD) process; and etching back the second dielectric layer 126, leaving the coating on the inner and outer sidewalls 126a, 126b and 128a and 128b respectively as shown. Subsequently, a tunnel oxide layer 134 is grown on the exposed common area 124 of the substrate 108 by exposing the substrate 108 to oxygen at high temperatures. Alternatively, the tunnel oxide layer 134 may be formed via a chemical vapor deposition (CVD) process. The resulting interface between the tunnel oxide, or thermal oxide layer 134 and the substrate 108 has low levels of ionic impurities and defects.

Figure 3C:
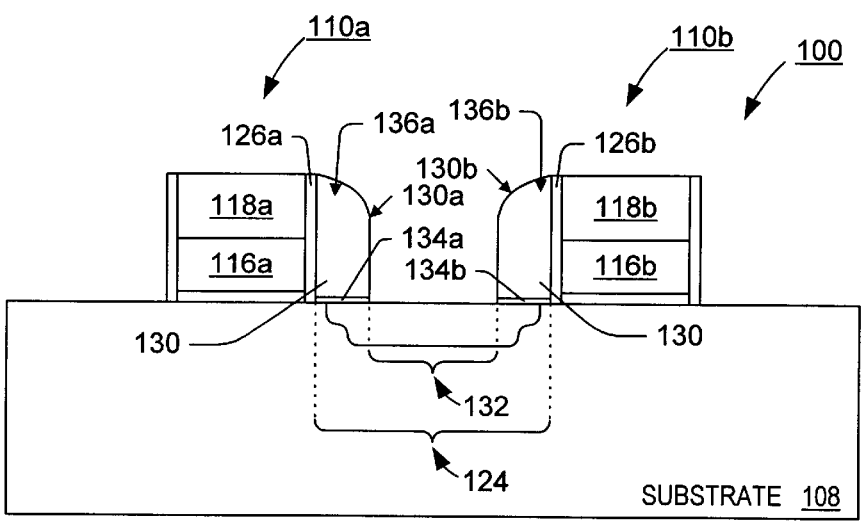

Referring to FIG. 3C, a second conductive layer 130 is initially deposited over the stacks 110a and 110b and over the tunnel oxide layer 134 (FIG. 3B). Subsequently, the second conductive layer 130 and the tunnel oxide layer 134 (FIG. 3B) are patterned in accordance with a lithography process, and etched to expose the medial portion 132 of the common source area 124 of the substrate 108 leaving the spacers 130a and 130b adjacent the second dielectric layer 126a and 126b respectively on the inner sidewalls 120a and 120b of the first and second stacks 110a and 110b respectively. The remaining portions of the second conductive layer 130 form the floating gates 136a and 136b of the first and second flash memory cells 102a and 102b (FIG. 2A) respectively.

Figure 3D:
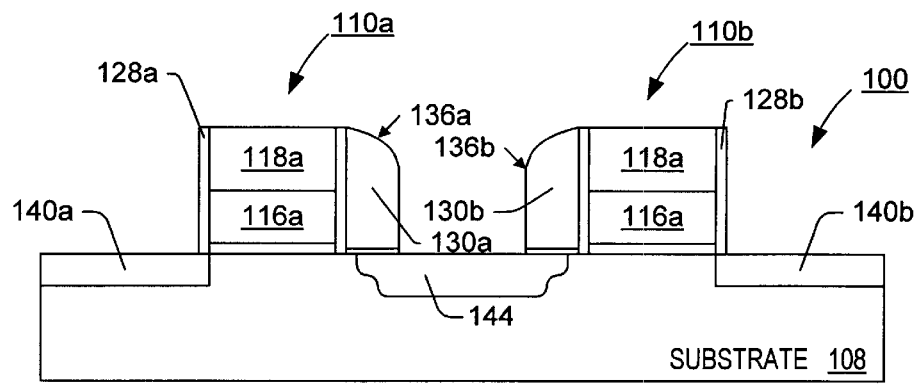

Referring to FIG. 3D, the substrate 108 is lightly doped, or diffused, to partially form the first and second drain regions 140a and 140b in the substrate 108 adjacent and outward from the outer sidewalls 122a and 122b of the first and second select gate stacks 110a and 110b respectively using the select gate stacks 110a and 110b as masking. The substrate 108 is also doped to form a common source region 144 in the substrate 108 intermediate the first and second select gate stacks 110a and 110b using the floating gate spacers 130a and 130b as masking.

Figure 3E:
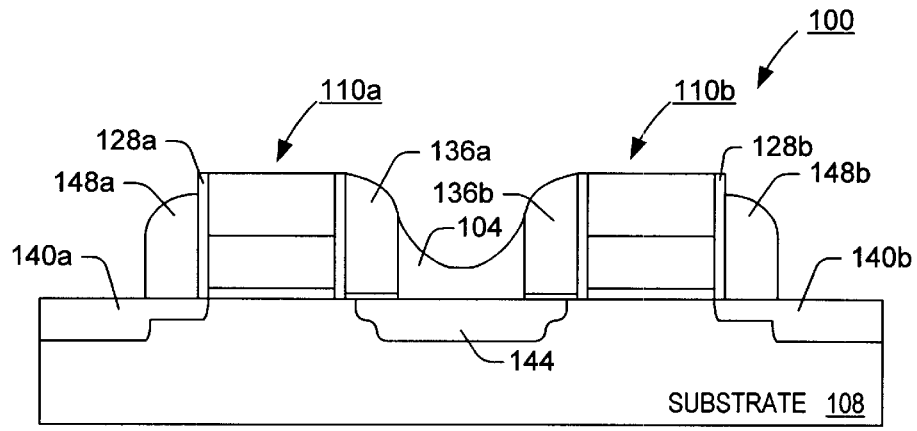

Referring to FIG. 3E, the outer spacers 148a and 148b are formed adjacent the sidewalls 128a and 128b adjacent the outer sidewalls 122a and 122b (FIG. 3A) of each of the first and second select gate stacks 110a and 110b respectively, and above the first and second drain regions 140a and 140b respectively. Subsequently, the substrate 108 is doped once again using the outer spacers 148a and 148b as ion implantation masks to complete the formation of the first and second drain regions 140a and 140b in the substrate 108. Note that a more lightly doped area of the first and second drain regions 140a and 140b is formed under the outer spacers 148a and 148b. Each of these more lightly doped areas is referred to as a lightly doped drain extension (LDD). Next, a dielectric layer 104 is formed superjacent the medial portion 132 of the common source area 144 of the substrate 108 intermediate the first and second select gate stacks 110a and 110b.

Figure 3F:
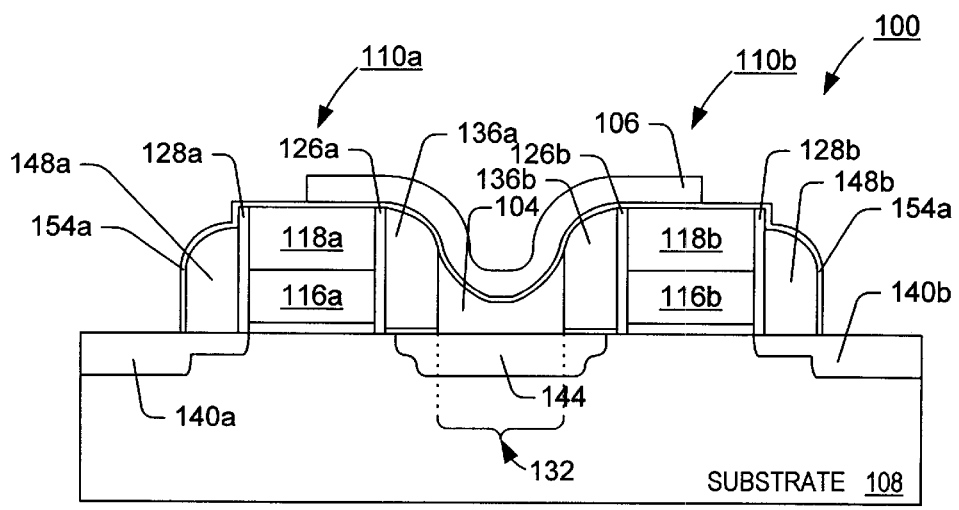

Referring to FIG. 3F, a fourth dielectric layer 154a is formed over the outer spacers 148a and 148b, second dielectric layer 126a, 126b, 128a, and 128b, the first and second select gate stacks 110a and 110b, the spacers 130a and 130b and the dielectric layer 104. In the preferred embodiment, the fourth dielectric layer 154a is formed from oxide-on-nitride-on-oxide (ONO). The third dielectric layers 104 and fourth dielectric layer 154a form the third dielectric layer 154 (FIG. 2A) of the flash semiconductor memory device in 100.

The common control gate 106 is formed by a third conductive layer formed over a medial portion of the dielectric layer 154a that is disposed over inner portions of the first and second select gate stacks 110a and 110b, the first and second spacers 130a and 130b, and the third dielectric layer 104.

The process of fabricating the pair of flash semiconductor memory devices 160 (FIG. 2B) diverges from the process of manufacturing the pair of flash memory devices 100 (FIG. 2A) in the step of forming the dielectric layer 154 (FIG. 2B) of the devices in 160. Before forming the dielectric layer 154, an etch back process is performed on the first dielectric layer 118a and 118b, as well as the second dielectric layers 126a, 126b and third side walls 128a, 128b. As a result, spacers 162a and 162b extend a distance vertical above the height of the first and second select gate stacks 110a and 110b as shown in FIG. 2B. Otherwise, the process of fabricating the pair of flash memory devices 160 (FIG. 2B) is substantially similar to the process of manufacturing the pair of flash memory devices in 100 (FIG. 2A).

In the embodiment described above, wherein the first, conductive layer 116 that functions as the select gate, the second conductive layer 130 that functions as the floating gate, and the third conductive layer that functions as the control gate 106 each can be formed with the material of polysilicon. Furthermore, each of the first, second, and third conductive layer may have different material, such as amorphous silicon, recrystalized amorphous silicon, or silicon alloy material, or other conductive material. The first dielectric layer 118, second dielectric layer 126, third dielectric layer 104, and fourth dielectric layer 1545 can be selected from a group consisting the following material; silicon dioxide, silicon nitride, and silicon nitride dioxide, such as oxide-on-nitride-on-oxide (ONO). These dielectric layers can be formed via the process of chemical vapor deposition (CVD).

Although the present invention has been particularly shown and described above with reference to a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A memory device including a first memory cell and a second memory cell, said device comprising:
   a substrate;
   a first select gate stack of the first memory cell and a second select gate stack of the second memory cell, each of said stacks including an insulating layer formed adjacent to said substrate, a select gate layer formed adjacent to said insulating layer, and a first dielectric layer formed adjacent to said select gate layer, each of said first and second select gate stacks further including an inner sidewall and an outer sidewall, said inner sidewalls of said first and second select gate stacks opposing each other and being separated by a common source area of said substrate, said inner and outer sidewalls of said first and second select gate stacks being coated with a second dielectric layer;
   a first and second floating gate spacers formed adjacent the portions of said second dielectric layer that are coated on said inner sidewalls of said first and second select gate stacks respectively, said first and second floating gate spacers being separated by a medial portion of said common source area of said substrate, each of said spacers including a tunnel oxide layer disposed over said substrate, and a floating gate layer disposed over said tunnel oxide layer;
   first and second drain regions formed in said substrate proximate and generally outward from said outer sidewalls of said first and second select gate stacks respectively;
   a common source region formed in said substrate generally beneath-said common source area;
   a third dielectric layer disposed over said medial portion of said common source area of said substrate, over said first and second-spacers, and over said first and second stacks; and
   a common control gate layer disposed adjacent to a portion of said third dielectric layer which overlies said inner portions of said first and second select gate stacks, said spacers, said floating gate layer, and said medial portion of said common source area of the first memory cell and the second memory cell.

2. A memory device as recited in claim 1, further comprising a first and second outer spacers formed adjacent the portions of said second dielectric layer that are coated on said outer sidewalls of said first and second select gate stacks, said first and second outer spacers being disposed generally above said first and second drain regions of said substrate.

3. A memory device as recited in claim 1, wherein said select gate layer is formed from a material selected from the group consisting of polysilicon, doped polysilicon, amorphous silicon, recrystalized silicon, and silicon alloy material.

4. A memory device as recited in claim 1, wherein said floating gate layer is formed from a material selected from the group consisting of polysilicon, doped polysilicon, amorphous silicon, recrystalized silicon, and silicon alloy material.

5. A memory device as recited in claim 1, wherein said common control gate layer is formed from a material selected from the group consisting of polysilicon, doped polysilicon, amorphous silicon, recrystalized silicon, and silicon alloy material.

6. A memory device as recited in claim 1, wherein the select gate, floating gate and control gate layers are all formed from the same material.

7. A memory device as recited in claim 1, wherein the select gate, floating gate and control gate layers each are formed from different materials.

8. A memory device as recited in claim 1, wherein the first dielectric layer is formed from a material selected from the group consisting of silicon dioxide, silicon nitride, and silicon nitride dioxide such as oxide-on-nitride-on-oxide (ONO).

9. A memory device as recited in claim 1, wherein the second dielectric layer is formed from a material selected from the group consisting of silicon dioxide, silicon nitride, and silicon nitride dioxide such as oxide-on-nitride-on-oxide (ONO).

10. A memory device as recited in claim 1, wherein the third dielectric layer is formed from a material selected from the group consisting of silicon dioxide, silicon nitride, and silicon nitride dioxide such as oxide-on-nitride-on-oxide (ONO).

11. A memory device as recited in claim 1, wherein the semiconductor memory device is a flash memory.

12. A memory device, comprising:
    a substrate;
    a first memory cell and a second memory cell, further comprising:
       a first select gate of the first memory cell and a second select gate of the second memory cell separated by a common source area, wherein the first select gate and the second select gate are formed adjacent to an insulating layer in the corresponding memory cell, said insulating layers formed adjacent to the substrate;
       a first floating gate of the first memory cell and a second floating gate of the second memory cell, each floating gate being formed adjacent to a dielectric layers formed on inner sidewalls of the first select gate and second select gate, wherein the inner sidewalls being separated by a medial portion of the common source area;
       a first and a second drain regions formed in the substrate generally outward from outer sidewalls of the first select gate and second select gate respectively;
       a common source region formed in the substrate generally beneath the common source area; and a common control gate disposed over said first select gate, said second select gate, and above said first floating gate, and said second floating gate.

13. A memory device as recited in claim 12, wherein said first select gate and second select gate are formed from a material selected from the group consisting of polysilicon, doped polysilicon, amorphous silicon, recrystalized silicon, and silicon alloy material.

14. A memory device as recited in claim 12, wherein said first floating gate and said second floating gate are formed from a material selected from the group consisting of polysilicon, doped polysilicon, amorphous silicon, recrystalized silicon, and silicon alloy material.

15. A memory device as recited in claim 12, wherein said common control gate is formed from a material selected from the group consisting of polysilicon, doped polysilicon, amorphous silicon, recrystalized silicon, and silicon alloy material.

16. A memory device as recited in claim 12, wherein the first and second select gates, first and second floating gates and control gate are all formed from the same material.

17. A memory device as recited in claim 12, wherein the first select gate, second select gate, first floating gate, second floating gate and control gate each are formed from different materials.

18. A pair of memory cells, comprising:
a first memory cell having a first select gate formed on a substrate and a first floating gate formed adjacent an inner sidewall of the first select gate and adjacent the substrate, and a first drain region formed in the substrate generally outward from an outer sidewall of the first select gate;
a second memory cell having a second select gate formed on said substrate separated from the first memory cell by a common source region of said first memory cell and said second memory cell in said substrate, and a second floating gate formed adjacent an inner sidewall of the second select gate and adjacent the substrate, wherein said second floating gate is separated from the first floating gate by a medial portion of the common source region, and a second drain region formed in the substrate generally outward from an outer sidewall of the first select gate; and
a control gate formed over said first select gate and said second select gate and adjacent to said first floating gate and said second floating gate as a common control gate to the first memory cell and the second memory cell.

19. A pair of memory cells as recited in claim 18, wherein said first select gate and second select gate are formed from a material selected from the group consisting of polysilicon, doped polysilicon, amorphous silicon, recrystalized silicon, and silicon alloy material.

20. A memory device as recited in claim 18, wherein said first floating gate and said second floating gate are formed from a material selected from the group consisting of polysilicon, doped polysilicon, amorphous silicon, recrystalized silicon, and silicon alloy material.

21. A memory device as recited in claim 18, wherein said common control gate is formed from a material selected from the group consisting of polysilicon, doped polysilicon, amorphous silicon, recrystalized silicon, and silicon alloy material.

22. A memory device as recited in claim 1, wherein the first and second select gates, first and second floating gates and control gate are all formed from the same material.

23. A memory device as recited in claim 18, wherein the first select gate, second select gate, first floating gate, second floating gate and control gate each are formed from different materials.

* * * * *